US010506353B2

(12) United States Patent
Wichmann et al.

(10) Patent No.: US 10,506,353 B2
(45) Date of Patent: Dec. 10, 2019

(54) HEARING DEVICE WITH A MICROPHONE STRUCTURE

(71) Applicant: Oticon A/S, Smørum (DK)

(72) Inventors: Søren Wichmann, Smørum (DK); Oliver Sundberg, København N (DK); Rasmus Andersson, San Jose, CA (US); Peter Spragge, Smørum (DK); Martin Larsen, Smørum (DK); Peter H. Weis, Smørum (DK); Anders Hedelund Nielsen, Smørum (DK)

(73) Assignee: OTICON A/S, Smørum (DK)

( * ) Notice: Subject to any disclaimer, the term of this patent is extended or adjusted under 35 U.S.C. 154(b) by 0 days.

(21) Appl. No.: 15/904,615

(22) Filed: Feb. 26, 2018

(65) Prior Publication Data
US 2018/0249261 A1 Aug. 30, 2018

(30) Foreign Application Priority Data
Feb. 27, 2017 (EP) ..................... 17158156

(51) Int. Cl.
*H04R 25/00* (2006.01)
*H04R 31/00* (2006.01)
*H05K 1/18* (2006.01)
*H04R 1/34* (2006.01)

(52) U.S. Cl.
CPC ......... *H04R 25/604* (2013.01); *H04R 25/402* (2013.01); *H04R 25/654* (2013.01); *H04R 31/006* (2013.01); *H05K 1/181* (2013.01); *H04R 1/342* (2013.01); *H04R 2201/003* (2013.01); *H05K 2201/09063* (2013.01); *H05K 2201/10083* (2013.01); *Y02P 70/611* (2015.11)

(58) Field of Classification Search
CPC .. H04R 25/604; H04R 31/006; H04R 25/654; H04R 25/402; H04R 1/342; H04R 2201/003; H04R 2201/09063; H05K 1/181; H05K 2201/10083; Y02P 70/611
USPC ........ 381/325, 111, 380, 313, 322, 355, 357
See application file for complete search history.

(56) References Cited

U.S. PATENT DOCUMENTS

| | | | |
|---|---|---|---|
| 2013/0129136 A1 | 5/2013 | Harney et al. | |
| 2014/0001580 A1 | 1/2014 | Bolognia et al. | |
| 2014/0193012 A1* | 7/2014 | Lindebjerg | H04R 25/608 381/328 |
| 2016/0165334 A1* | 6/2016 | Grossman | H04R 1/023 381/328 |
| 2016/0261960 A1* | 9/2016 | Pedersen | H04R 25/48 |

FOREIGN PATENT DOCUMENTS

| | | |
|---|---|---|
| EP | 2424275 A1 | 2/2012 |
| WO | WO 2016/089671 A1 | 6/2016 |

* cited by examiner

*Primary Examiner* — Melur Ramakrishnaiah
(74) *Attorney, Agent, or Firm* — Birch, Stewart, Kolasch & Birch, LLP

(57) ABSTRACT

A hearing aid device comprising a microphone, a processing unit and a receiver for compensating for a hearing loss in the auditory system of a human is disclosed. The hearing aid device is configured with a microphone inlet assembly which is optimized with regards to maintenance of the hearing aid and improved sound performance. That is, the microphone inlet assembly comprises an inlet element attached to a PCB and further configured to connect with a sound inlet structure.

20 Claims, 7 Drawing Sheets

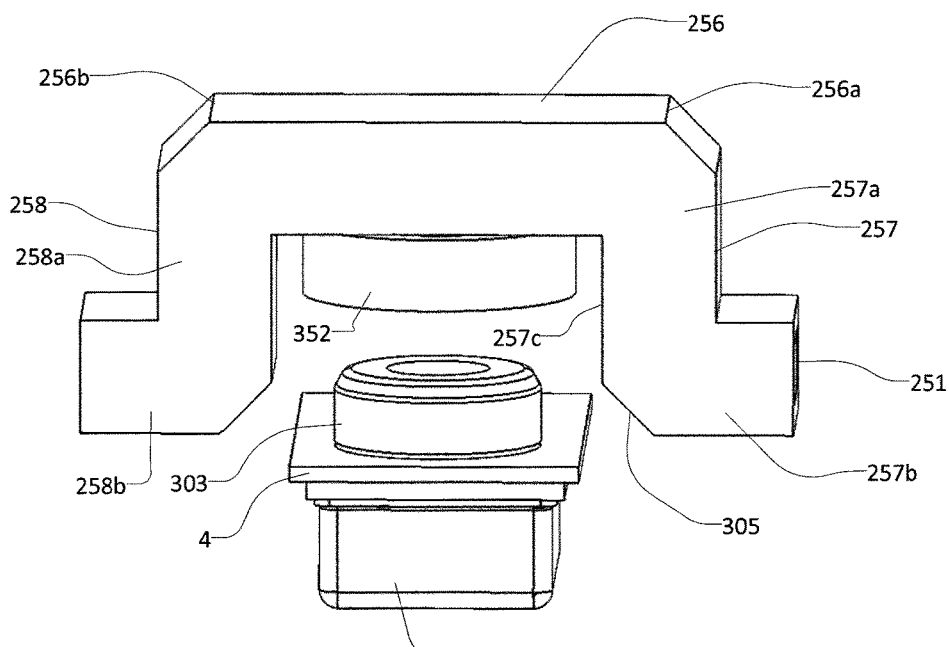
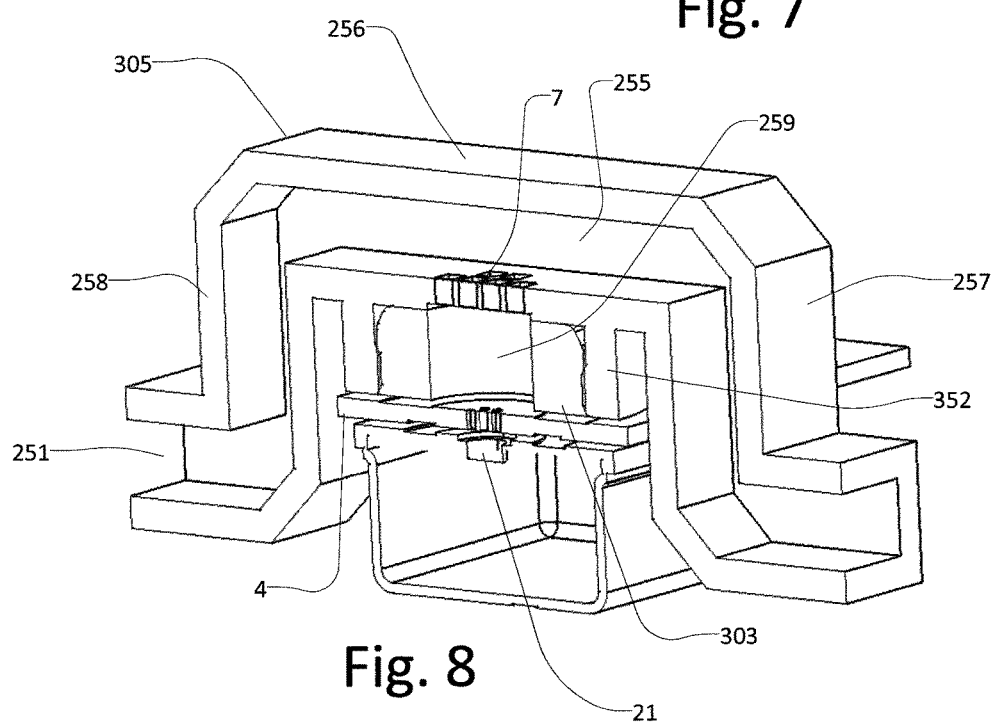

HEARING DEVICE WITH A MICROPHONE STRUCTURE

FIELD

The present disclosure relates to a hearing device, such as a hearing aid, comprising a microphone structure providing an improved sound path of the hearing device. More particularly, the disclosure relates to a microphone structure of a hearing device providing an efficient sealing and damping of unwanted frequencies.

BACKGROUND

Within the field of hearing aid devices, it is a general focus and aim to provide small and inconspicuous devices, which may provide the hearing aid user with a hearing device that has good sound quality without forming a large and visible device.

Accordingly, there has been a focus on minimizing the electrical components, such as receiver systems, microphones etc., which take up space in the interior housing structure of a hearing aid.

Through the years an increased focus has been given to the MicroElectroMechanical System (MEMS) microphones and how to alter the construction of the microphones and the mounting construction thereof, in order to limit the interior space in e.g. hearing aids, needed for the microphones, while at the same time providing a good sound quality to the hearing aid user. That is, one of the most important properties of the microphone is to enable a good acoustical performance in the hearing aid.

Such microphone solutions are typically located inside the hearing devices, and are arranged in connection with an acoustic path extending between the exterior environment of the hearing aid (i.e. the environment on an outer shell part of the hearing aid) and the microphone inside the hearing device in order to feed the microphone with an environmental sound.

With the aim of limiting the space used for different electronic components, it is often considered to use a printed circuit board (PCB) onto which the electronic components may be mounted by e.g. soldering. When using surface mounted electronic components on the PCB, e.g. soldering a microphone onto a PCB, this component is not easily removed and re-installed or replaced, which is often needed during service of the hearing aid device. Accordingly, a simple change of the electrical components, such as a microphone, in case of component dysfunction is not easily done, why other means for ensuring the functionality of the electrical components of the hearing aid device is needed. As an example, the functionality of microphones and/or speaker units has to be ensured by avoiding that the acoustical path gets clogged or in any other way obstructed, by e.g. moist, dirt, sweat, or other foreign substances. Furthermore, the limited space in a hearing device, such as a hearing aid, also limits the amount of filters or other components, which could be mounted in connection with the microphone in order to optimize the acoustics of the hearing device.

Therefore, there is a need to provide a solution that provides a reliable and mechanically stable mounting of a microphone assembly in a hearing aid device, which may allow for easy service and at the same time provide an acoustical improved device.

SUMMARY

This and further objectives are met by a hearing aid device according to the disclosure, where the hearing aid device comprises at least one microphone structure configured for receiving an acoustic signal from an environment and to process the acoustic signal into an electrical signal. A processing unit is arranged in the hearing aid device and configured for receiving the electrical signal and modifying the signal based on a hearing loss compensation. Furthermore, a receiver is configured to receive the modified electrical signal and process the modified electrical signal into an acoustic signal, and further to transmit said acoustic signal to a part of the auditory system of a hearing impaired user.

The auditory system consists of the external ear, the middle ear and the inner ear. Accordingly, a hearing loss arising in any one of these parts of the auditory system can be compensated by choosing either a hearing aid solution, a bone-anchored solution or a cochlear implant depending on the origin and degree of the hearing loss.

Accordingly, a hearing device should be considered as any suitable device, which is configured to compensate for a hearing loss by receiving a sound from the external environment (e.g. through use of microphones) and transfer the sound to a part of the auditory system.

The hearing device comprises a microphone structure, which has a microphone aperture arranged in a microphone housing structure. Additionally, the hearing aid device is configured with a printed circuit board, wherein an inlet element is arranged on a first side of the printed circuit board and the microphone housing structure is arranged on a second side of said printed circuit board. According to the disclosure, the inlet element is configured to receive a sound inlet structure, where the sound inlet structure is configured to provide an acoustic path from the environment to the microphone aperture. With a microphone inlet construction in accordance herewith, a microphone inlet assembly, which improves the maintenance capabilities of the microphone, is achieved.

That is, when mounting a microphone on a PCB, it is not easily exchanged, why the need for a microphone inlet structure which is exchangeable in order to preserve a maintenance possibility of the hearing aid, without having to demount the microphone structure from the PCB. Accordingly, the sound inlet structure according to the disclosure, can easily be mounted onto the inlet element and also easily removed when e.g. a clogged sound path is present.

According to an embodiment, the sound inlet structure is configured to press-fit, snap, screw or click into engagement with said inlet element. That is, the sound inlet structure is configured with engagement constructions, which allow a detachable connection with an inlet element of a PCB.

A press-fit connection is preferred since this allows for an easy and intuitive mounting and removal of the sound inlet structure to the inlet element. Furthermore, a press-fit connection according to the embodiment of the disclosure is reliable and maintenance free.

That is, the sound inlet structure can be attached to the inlet element in any suitable manner, such as by a press-fit (i.e. the fit of a shaft driven into a hole slightly smaller than the shaft itself and held tight and motionless).

As an alternative, the attachment between the sound inlet structure and the inlet element may be provided by a snap-fit, a click-fit (i.e. a connection which causes the sound inlet structure to make a short, sharp sound when correctly mounted onto the inlet element), or a screwing operation (i.e. where the sound inlet structure and the inlet comprises matching thread structures, such that the sound inlet structure can be screwed onto the inlet element).

In more detail, the sound inlet structure may in an embodiment comprise a first engagement structure having a first cross-section, where the inlet element comprises a second engagement structure having a second cross-section, wherein the first and second engagement structures provide a sealing between the sound inlet structure and said inlet element. Such sealing ensures that sound does not leak into the acoustic path from the environment to the microphone structure, where it is processed.

In an embodiment, the inlet element may be mounted onto the printed circuit board in a process of soldering, welding or e.g. gluing. In any case of process chosen, the inlet element is mounted onto the printed circuit board in such tight manner that a sealing between a surface of the printed circuit board and the inlet element is achieved.

In a further embodiment, the first cross-section may be bigger than the second cross-section allowing the first engagement structure to engage an outer surface of the second engagement structure. In an alternative embodiment, the first cross-section may be smaller than the second cross-section allowing the first engagement structure to engage an inner surface of said second engagement structure. Accordingly, a press-fit engagement may be achieved by at least two alternatives, where the cross-sections are such that a tight and sealing engagement between the structures of the engagement element of the inlet element and the sound inlet structure is achieved.

In an embodiment, the sound inlet structure comprises a center portion having a first end and a second end, wherein a first arm extends from the first end and a second arm extends from the second end. This allows for a two sided sound path, where sound may enter the sound inlet structure from two sides. Accordingly, the first and second end should be understood to extend a distance from each other in a longitudinal direction of the inlet structure. In this way, when arranged in a hearing aid, the two ends of the sound inlet structure may e.g. extend towards two opposing sides of the hearing aid shell so as to pick up sound from either sides.

In another embodiment, the sound inlet structure may comprise at least one arm extending from the center portion. Furthermore, the sound inlet structure, independent of the design with a center portion having one or more arms, may be arranged in a hearing device shell structure in such manner, that the sound inlet structure forms an integrated part of the shell structure. That is, when mounting the shell structure to e.g. another shell structure of the hearing device, the sound inlet structure formed in a part of the shell structure is connected directly to the inlet element so as to e.g. form a press-fit engagement between the shell structure and the inlet element.

In a further embodiment, the first and second arm forms an L-shaping, wherein a base of the L-shape extends parallel with a longitudinal extension of the center portion. That is, a so-called balanced inlet of the sound inlet structure may be achieved, meaning that built up pressure in the L-shape part of the inlet reduces diaphragm vibration within the microphone housing structure.

In order to prevent foreign substances from entering the microphone structure and potentially disturbing the acoustic sound path and sound processing inside the microphone structure, the sound inlet structure may in one embodiment be configured with a wax filter, where the wax filter is arranged in connection with an opening of the sound inlet structure. This allows the sound inlet structure to trap wax or other foreign substance inside the sound inlet structure (in an inner sound channel thereof), so that it does not enter the microphone structure. Accordingly, when removing the sound inlet structure from the inlet element, due to maintenance of the hearing aid device, the entire inlet structure may be thrown out together with potentially trapped wax inside, and a new and clean sound inlet structure is attached. In this way, the sound inlet structure improves the sound path.

In a further embodiment, the microphone inlet assembly according to the disclosure has been optimized in view of signals with undesired frequency components, such as in the range of e.g. ultrasound frequencies (i.e. unwanted high frequency signals) potentially entering the internal acoustic path (i.e. from microphone to processor unit to receiver) of the hearing aid. That is, in one embodiment the printed circuit board is configured with a filter structure, which filter structure is arranged between the microphone aperture in the microphone housing structure and the inlet element. This allows for a dampening of sound prior to the sound entering the microphone structure. Accordingly, environmental sound, which is received in the sound inlet structure is led to the PCB and through the filter structure in the PCB, where the sound experiences a damping effect.

In more detail, this filter structure may in one embodiment be configured to dampen a resonance frequency at high frequencies. In an embodiment, the filter structure is configured to dampen a frequency response of the microphone in the range of 10 to 20 and/or above 20 kHz. This filter configuration is achieved using standard machinery already present in a normal production setup. Additionally it allows for obtaining an accurate and reproducible filter structure. The filter structure will be elaborated on in more detail throughout the description.

More particularly, in one embodiment, the filter structure is provided as one or more openings embedded in the printed circuit board, so as to be arranged between the microphone aperture in the microphone housing structure and the inlet element. By embedding (e.g. integrating) the filter structure into the PCB in this manner, a more efficient production and less components used for dampening is achieved.

For an efficient damping effect, the number of openings of the filter structure may ranging from 3 openings and upwards. A typical range would be upwards from 3 to around 36 or more openings.

Furthermore, in an embodiment, the microphone may be a MEMS-type microphone or any other surface mounted microphone, which is suitable for mounting (e.g. by soldering) onto a PCB.

It should be noted that the filter structure in one embodiment may be embedded (i.e. integrated) into the PCB by e.g. stamping, laser cutting, drilling, or etching.

In an aspect, a method for manufacturing a hearing aid device according to the disclosure is disclosed.

BRIEF DESCRIPTION OF DRAWINGS

The embodiments of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each embodiment may each be combined with any or all features of the other embodiments. These and other embodiments, features and/or technical effect will be apparent from and elucidated with reference to the illustrations described hereinafter in which:

FIG. 7 illustrates a cross-sectional side view of a microphone inlet assembly of a hearing aid according to an embodiment of the disclosure;

FIG. 8 illustrates a cross-sectional side view of a microphone inlet assembly according to FIG. 7 with a filter;

DETAILED DESCRIPTION

Figure 1:
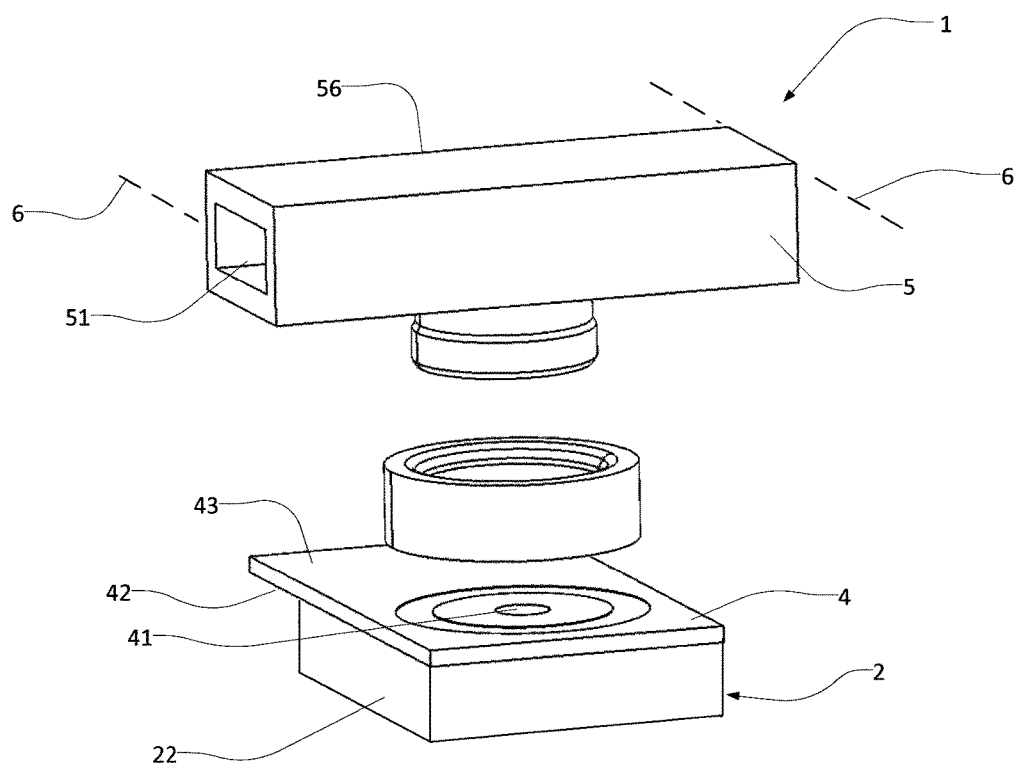
FIG. 1 illustrates an exploded view of a microphone structure and a microphone inlet assembly of a hearing aid according to an embodiment of the disclosure.

The detailed description set forth below in connection with the appended drawings is intended as a description of various configurations. The detailed description includes specific details for the purpose of providing a thorough understanding of various concepts. However, it will be apparent to those skilled in the art that these concepts may be practiced without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

A hearing device may refer to a hearing aid that is adapted to improve or augment the hearing capability of a user by receiving an acoustic signal from a user's surroundings, generating a corresponding audio signal, possibly modifying the audio signal and providing the possibly modified audio signal as an audible signal to at least one of the user's ears. The "hearing device" may further refer to a device such as an earphone or a headset adapted to receive an audio signal electronically, possibly modifying the audio signal and providing the possibly modified audio signals as an audible signal to at least one of the user's ears. Such audible signals may be provided in the form of an acoustic signal radiated into the user's outer ear, or an acoustic signal transferred as mechanical vibrations to the user's inner ears through bone structure of the user's head and/or through parts of middle ear of the user or electric signals transferred directly or indirectly to cochlear nerve and/or to auditory cortex of the user.

The hearing device is adapted to be worn in any known way. This may include i) arranging a unit of the hearing device behind the ear with a tube leading air-borne acoustic signals into the ear canal or with a receiver/loudspeaker arranged close to or in the ear canal such as in a Behind-the-Ear type hearing aid, and/or ii) arranging the hearing device entirely or partly in the pinna and/or in the ear canal of the user such as in a In-the-Ear type hearing aid or In-the-Canal/Completely-in-Canal type hearing aid, or iii) arranging a unit of the hearing device attached to a fixture implanted into the skull bone such as in Bone Anchored Hearing Aid or Cochlear Implant, or iv) arranging a unit of the hearing device as an entirely or partly implanted unit such as in Bone Anchored Hearing Aid or Cochlear Implant.

A "hearing system" refers to a system comprising one or two hearing devices, and a "binaural hearing system" refers to a system comprising two hearing devices where the devices are adapted to cooperatively provide audible signals to both of the user's ears. The hearing system or binaural hearing system may further include auxiliary device(s) that communicates with at least one hearing device, the auxiliary device affecting the operation of the hearing devices and/or benefitting from the functioning of the hearing devices. A wired or wireless communication link between the at least one hearing device and the auxiliary device is established that allows for exchanging information (e.g. control and status signals, possibly audio signals) between the at least one hearing device and the auxiliary device. Such auxiliary devices may include at least one of remote controls, remote microphones, audio gateway devices, mobile phones, public-address systems, car audio systems or music players or a combination thereof. The audio gateway is adapted to receive a multitude of audio signals such as from an entertainment device like a TV or a music player, a telephone apparatus like a mobile telephone or a computer, a PC. The audio gateway is further adapted to select and/or combine an appropriate one of the received audio signals (or combination of signals) for transmission to at least one hearing device. The remote control is adapted to control functionality and operation of the at least one hearing devices. The function of the remote control may be implemented in a SmartPhone or other electronic device, the SmartPhone/electronic device possibly running an application that controls functionality of the at least one hearing device.

In general, a hearing device includes i) an input unit such as a microphone for receiving an acoustic signal from a user's surroundings and providing a corresponding input audio signal, and/or ii) a receiving unit for electronically receiving an input audio signal. The hearing device further includes a signal processing unit for processing the input audio signal and an output unit for providing an audible signal to the user in dependence on the processed audio signal.

The input unit may include multiple input microphones, e.g. for providing direction-dependent audio signal processing. Such directional microphone system is adapted to enhance a target acoustic source among a multitude of acoustic sources in the user's environment. In one aspect, the directional system is adapted to detect (such as adaptively detect) from which direction a particular part of the microphone signal originates. This may be achieved by using conventionally known methods. The signal processing unit may include amplifier that is adapted to apply a frequency dependent gain to the input audio signal. The signal processing unit may further be adapted to provide other relevant functionality such as compression, noise reduction, frequency transposing etc. The output unit may include an output transducer such as a loudspeaker/receiver for providing an air-borne acoustic signal transcutaneously or percutaneously to the skull bone or a vibrator for providing a structure-borne or liquid-borne acoustic signal. In some hearing devices, the output unit may include one or more output electrodes for providing the electric signals such as in a Cochlear Implant. Each of these different types of hearing device solutions is chosen in dependency of what part of the human auditory system is dysfunctional.

As previously elaborated on there exists a need for making hearing aids smaller and less conspicuous, which entails size constrains on the internal components of the hearing aid. Accordingly, e.g. the microphone inlet assembly construction as disclosed herein in different embodiments may be used in hearing aids in an efficient manner, while allowing for a good sound quality.

Referring initially to FIG. 1, a general schematic overview of a microphone inlet assembly 1 of a hearing aid is illustrated. The microphone inlet assembly 1 comprises a microphone structure 2 and an inlet element 3 which are arranged in connection with each other through a PCB 4. Furthermore, a sound inlet structure 5 is arranged in connection with the inlet element 3.

In more detail, the microphone structure 2 comprises a microphone aperture (not shown) arranged in a microphone housing structure 22. The microphone housing structure 22 is connected to the PCB 4 on one side 42, preferably by soldering, where the PCB 4 comprises a sound hole 41 through which sound is guided to the microphone aperture. On the other side 43 of the PCB 4, an inlet element 3 is arranged so that sound may be guided through the inlet element 3 to the sound hole 41 and further into the microphone structure 2. Inside the microphone structure 2 a received acoustic signal (i.e. a sound signal) from the environment is processed into an electrical signal and transferred to a processing unit in order to compensate for a hearing loss. From here the electrical signal is transferred to a receiver (not shown) to be converted into a sound signal emitted to a part of the auditory system of a hearing impaired.

A sound inlet structure 5 is arranged in connection with the inlet element 3, where the sound inlet structure 5 is configured for guiding the sound from the exterior environment into the inlet element 3 and the microphone structure 2 in an efficient way. The sound inlet structure 5 comprises one or more openings 51 that are in acoustical communication with a sound opening of a hearing aid housing, schematically illustrated by the dotted lines 6 in FIG. 1. It should be understood, that the dotted lines 6 illustrate a fictive borderline to the environment of the hearing aid. Accordingly, the openings 51 are arranged inside the hearing aid such that they are in direct or indirect acoustic communication with an exterior environment of the hearing aid.

As previously described, the microphone structure 2 is preferably surface mounted (e.g. by soldering) to the printed circuit board, why it is not easily exchanged with a new device. Accordingly, for efficient maintenance of the microphone, which is under environmental influence of e.g. dirt or moist, it has been realized that other means for protection of a non-exchangeable microphone is needed, why the inlet structure assembly 1 according to the disclosure has been found a suitable and well-functional solution.

Accordingly, in more detail, the inlet structure assembly 1 is configured such that the inlet element 3 is mounted on the PCB 4, where the sound inlet structure 5 is configured to be releasable attached to the inlet element 3. This allows for an easy exchange of the sound inlet structure 5, where dirt, moist or other foreign substances are or at least may be trapped prior to reaching the microphone structure 2. The microphone inlet assembly 1 according to the disclosure therefore provides an efficient guide of sound from the environment to the microphone structure 2 while at the same time protecting the microphone structure 2 from objects of the environment, such that an exchange of the microphone structure 2 due to dysfunctionality is substantially avoided. Instead, the sound inlet structure is easily exchanged. It should be noted that the PCB 4 is a PCB element which is arranged onto a second PCB which form part of the microphone housing, which will become apparent at least in view of FIG. 10, where it is seen and described that a first PCB 4 and a second PCB (i.e. a microphone PCB 24) forms part of the microphone assembly. The sound inlet structure 5 could thus be arranged both on a microphone PCB 24 or at the first PCB 4.

As previously elaborated on, the mounting of the inlet element to the PCB may be done by e.g. welding, soldering or e.g. gluing. This allows for a tight mounting which makes sure that the inlet element seals to the PCB thereby preventing sound escaping from the inlet element. The soldering process could be done by e.g. a reflow process, where the inlet element in a first step is attached to the PCB by use of gluing paste, whereby in a second step the pre-attached inlet element is pushed through a heating process, whereby a tight and sealing mounting of the inlet element to the PCB is achieved.

The releasable attachment between the sound inlet structure 5 and the inlet element 3 is preferably obtained by a press-fit, snap, screwing or click action.

Figure 2:
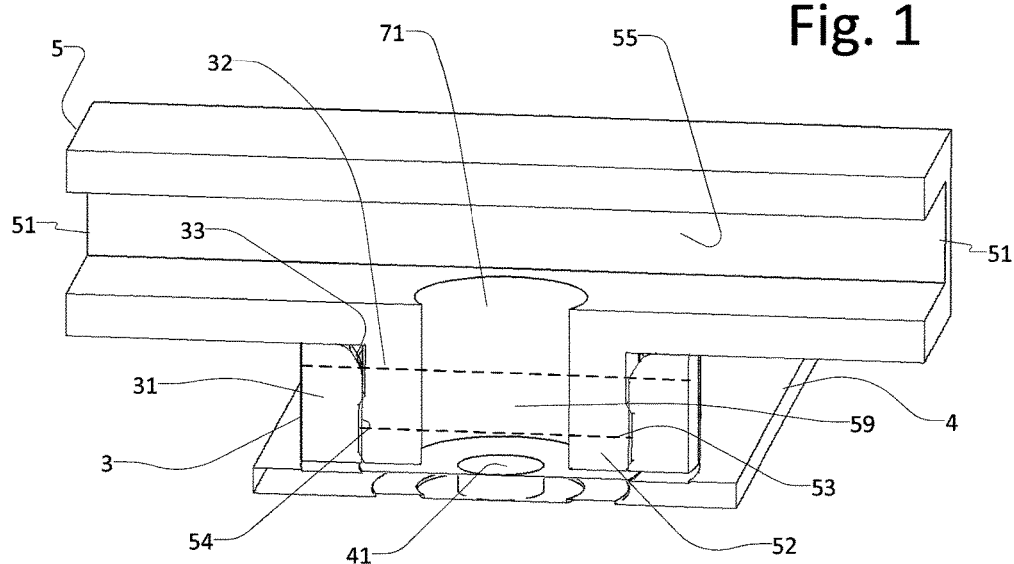
FIG. 2 illustrates an assembled cross-sectional side view of the microphone inlet assembly in FIG. 1.

That is, the sound inlet structure 5, as illustrated in more detail in the embodiment of FIG. 2, comprises a first engagement structure 52 having a first cross-section 53 and the inlet element 3 comprises a second engagement structure 31 having a second cross-section 32, wherein the first 52 and second engagement structures 31 provide a sealing between the sound inlet structure 5 and the inlet element 3.

With regards to the sealing between the inlet structure and the inlet element, it should be noted that it may be obtained directly due to the tight connection from the press-fit between the engagement structures, as will be described in more detail in the following.

In more detail, and with reference to at least the embodiments of FIGS. 1 and 2, the first engagement structure 52 of the sound inlet structure 5 is provided with a cross-section 53 (also denoted the first cross-section) which is smaller than the cross-section 32 (also denoted the second cross-section) of the second engagement structure 31 of the inlet element 3. The different sized first and second cross-sections allows the first engagement structure 52 to engage an inner surface 33 of the second engagement structure 31. A cross-section within the meaning of the disclosure should be understood to be defined as a distance (e.g. a width) of the engagement structures 31, 52 extending from a point on an exterior surface of e.g. the engagement structure 52 to a point on an opposing second surface of the same element (i.e. the engagement structure 52) and according to the dotted line 53 of FIG. 2. Accordingly, when attaching the sound inlet structure 5 to the inlet element 3, the engagement structure 52 of the sound inlet structure 5 may in the embodiment shown in at least FIGS. 1 and 2 press-fit into engagement with the inner sides 33 of the inlet element 3, whereby a friction between the sides 33 of the inlet element and sides 54 of the first engagement structure 52 is achieved, thereby maintaining the sound inlet structure 5 in the inlet element 3.

Figure 3:
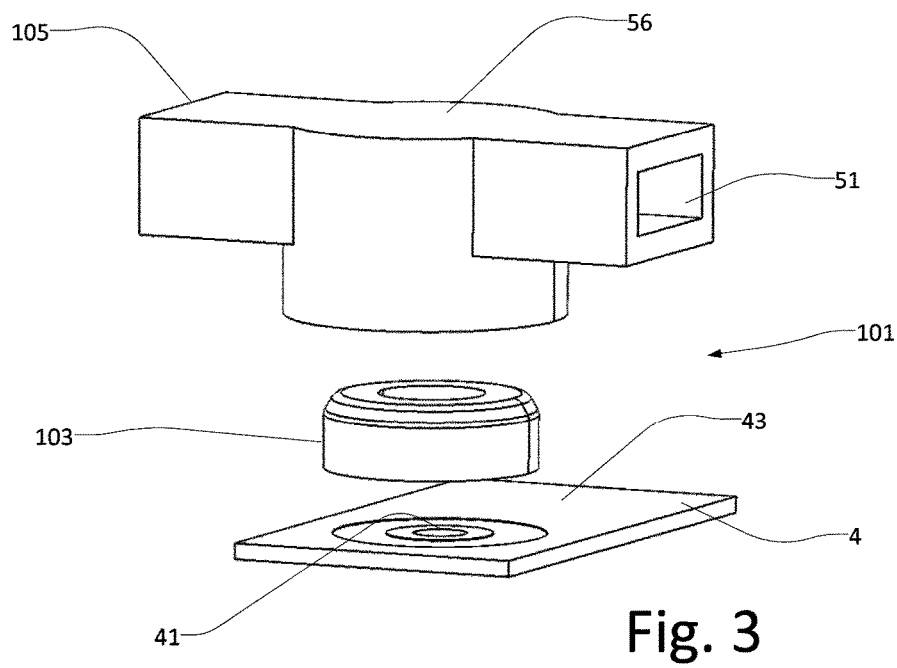
FIG. 3 illustrates an exploded view of a microphone inlet assembly of a hearing aid according to an embodiment of the disclosure.
Figure 4:
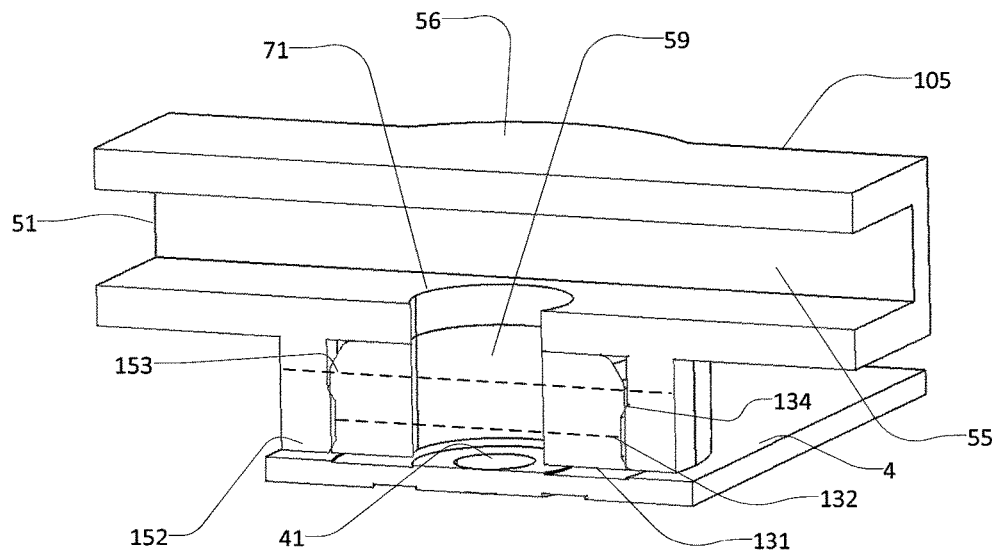
FIG. 4 illustrates an assembled cross-sectional side view of the microphone inlet assembly in FIG. 3.

In an embodiment illustrated in FIGS. 3 and 4 a similar microphone inlet assembly 101 as described in relation to FIGS. 1 and 2 is shown. It should be noted that similar features as previously described are provided with the same numbering with a 100 added. The microphone inlet assembly 101 illustrated in FIGS. 3 and 4 works in a substantially similar way as previously described. However, a slight difference in this embodiment is constituted by the first cross-section 153 of the first engagement structure 152 of the sound inlet structure 105 is bigger than the second cross-section 132 of the second engagement structure 131 of the inlet element 103. This construction allows the first engagement structure 152 to engage an outer surface 134 of the second engagement structure 131. Accordingly, a similar press-fit as described in relation to FIGS. 1 and 2 may be obtained between the inlet element engagement structure 132 and the sound inlet structure engagement structure 152.

With reference to e.g. FIGS. 1 and 2 the sound inlet structure 5, is generally configured as a longitudinal element comprising as channel 55 having an opening 51 in one or more ends thereof. In a portion (e.g. a center portion 56) of the sound inlet structure 5, the first engagement structure 52 is protruding downwards from the inlet structure 5, so as to form the engagement structure 52. As illustrated in FIGS. 1 and 2, the engagement structure 52 may be formed with a first part 52a and a second part 52b, where the second part 52b comprises a slightly larger cross-section than the first part 52a. The second part 52b is accordingly configured to substantially create the before mentioned press-fit with the second engagement structure 31 of the inlet element 3 by engaging the sides 33 of the inlet element 3 in a frictional manner. Furthermore, the inlet structure 5 comprises a sound opening 71, which is intended to guide the sound received in the channel 55 to the microphone structure 2 through the sound opening 71. The sound opening 71 extends from the channel sides into the engagement structure 52. That is, it could be understood that an inner channel 59 of the engagement structure also forms a sound guide, which is in acoustic communication with the sound hole 41 of the PCB 4.

With regards to the embodiment of FIGS. 3 and 4 it is clear that a corresponding construction of the engagement structure forms part of the press-fit engagement, and it will therefore not be elaborated on in further detail. Accordingly, the numbering is the same for features corresponding to those described in relation to FIGS. 1 and 2. Features, slightly differing in e.g. construction, but having substantially the same function have been described with a numbering, with a hundred added.

Figure 12:
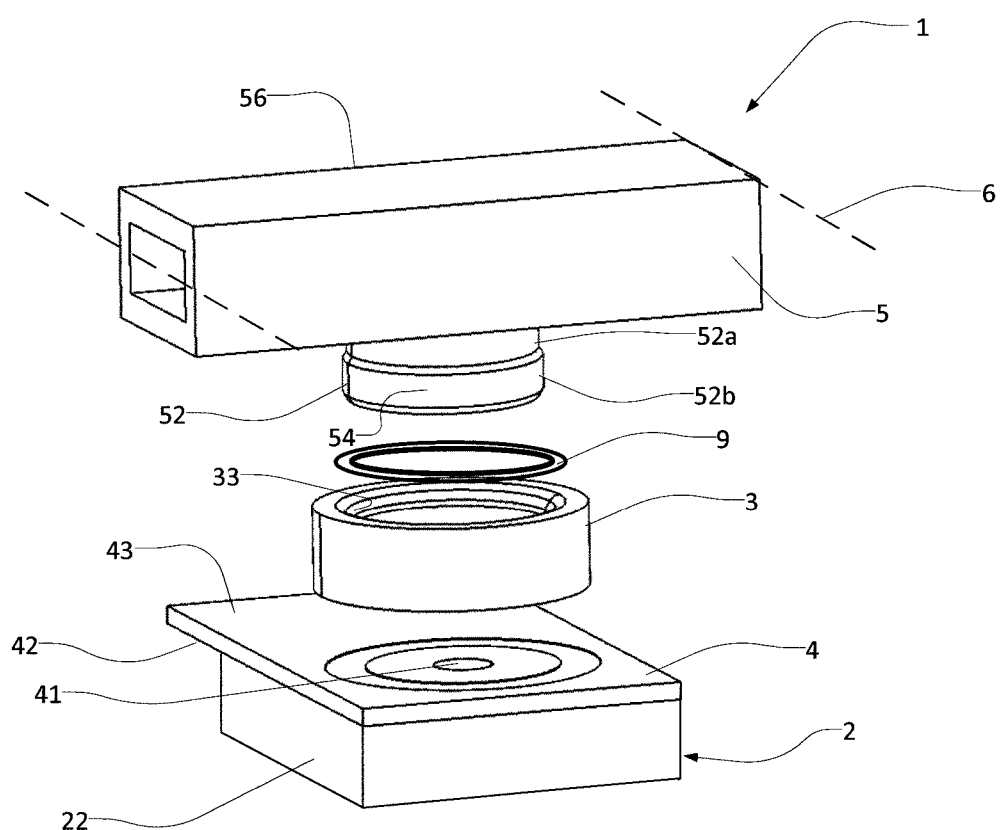
FIG. 12 illustrates an embodiment according to FIG. 1, where an O-ring is applied.

In an alternative embodiment, the inlet element 3 and/or the sound inlet structure 5 may be provided with an O-ring 9 in order to create a sealing between the inlet element 3 and the sound inlet structure 5. Such, O-ring solution is illustrated in FIG. 12, where it is seen that an O-ring 9 can be provided as an extra element in connection with either the inlet element 3 or the engagement structure 52 of the sound inlet structure 5. That is, the O-ring 9 can be placed e.g. on the outer part of the sides 54 of the engagement structure 52 of the sound inlet structure 5 or e.g. as an alternative in the inlet element on inner sides 33 thereof. In either way, an efficient seal is achieved.

In a further embodiment, not illustrated in more detail, the O-ring 9 may also in an embodiment be arranged in the outer sides of the inlet element 3, such that the outer circumference of the inlet element comprises and O-ring 9. In this case, when the engagement structure 52 engages with the inlet element on the outer sides therefor (c.f. FIGS. 3 and 4), the O-ring 9 also creates a sealing effect of the engagement between the inlet element 3 and the engagement structure 52. Furthermore, the O-ring 9 could also be arranged on an inner side of the engagement structure 52, which provides an equally good seals as the previous options described.

Figure 5:
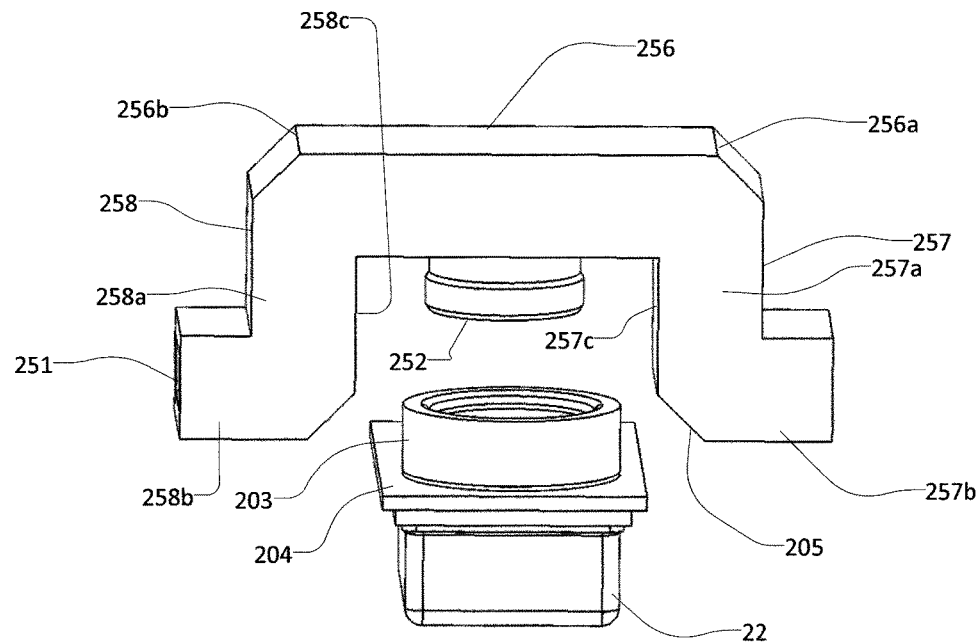
FIG. 5 illustrates an exploded view of a microphone inlet assembly of a hearing aid according to an embodiment of the disclosure.
Figure 6:
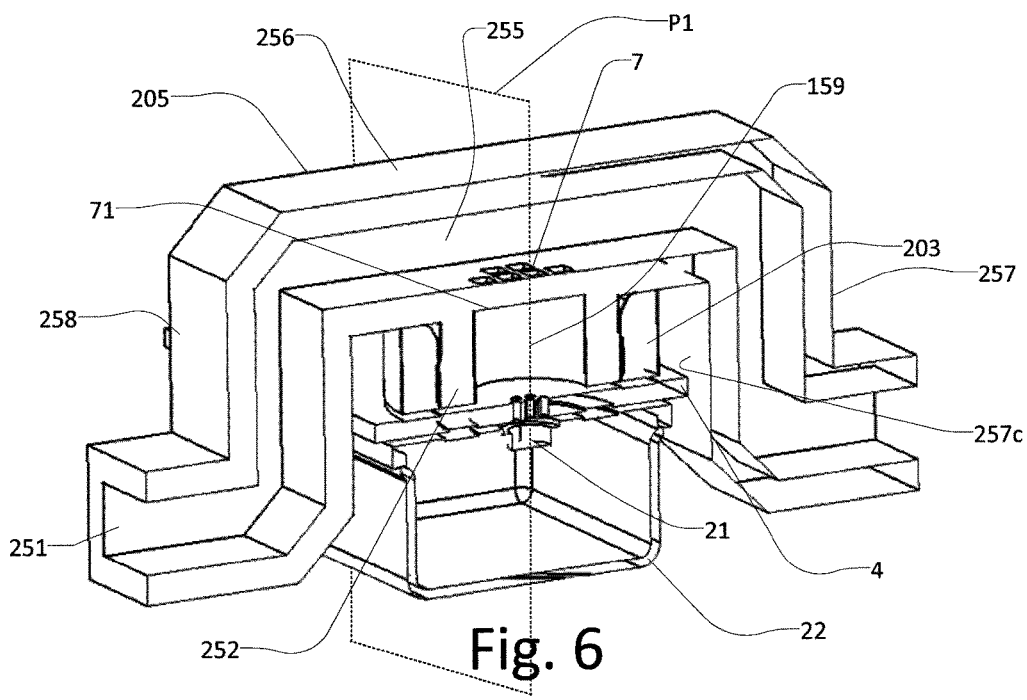
FIG. 6 illustrates a cross-sectional side view of a microphone inlet assembly according to FIG. 5 with a filter.

Turning now to FIGS. 5 and 6 an embodiment according to the disclosure is illustrated. In this embodiment, the sound inlet structure 205 has a slightly different shape. Here the sound inlet structure 205 comprises a center portion 256 (as previously described as the center portion 56) having a first end 256a and a second end 256b, wherein a first arm 257 extends from the first end and a second arm 258 extends from the second end. Accordingly, the sound inlet structure 205 has a substantially stepped and/or angled sound channel With this construction of the sound inlet structure 205 it is ensured that a balanced inlet is achieved. By balanced inlet should be understood that the inlet is designed and arranged such that a pressure build-up in and around the microphone due to external vibrations influencing the microphone is counteracted for. It should be noted, that even though, the design is illustrated with at least two arms, only one arm could be used, while still obtaining a suitable solution.

Furthermore, with this construction of the inlet structure 205, an efficient alignment of the hearing aid inlet structure 205 in the hearing aid housing is achieved. That is, each opening 251 of the inlet structure 205 could is with this construction easily aligned in a "split line" between two housing shells of a hearing device. Some hearing devices consist of two housing shells, in which a small "hole" is configured to allow sound to enter into the hearing aid through e.g. a sound inlet structure 205 as described herein. Accordingly, in one embodiment the openings 251 is "looking" into the environment of the hearing aid housing, trough e.g. a hole in the split line between two shell parts of the hearing aid.

In more detail, the first arm 257 and second arm 258 form an L-shaping extending from the first end 256a and the second end 256b. That is, a part 257a of the first arm extends from the first end 256a forming a substantially 90 degree angle with the first end 256a of the center portion 256. It should be noted that the angle could be any angle suitable to obtain a suitable bend forming the L-shaping of the sound inlet structure. At the end opposed to the first end 256a of the sound inlet structure 205 the first arm 257 comprises a foot-part 257b which protrudes from the part 257a towards an exterior environment. That is, it forms an opening to the exterior environment of a hearing aid casing, so as to allow for sound to enter an opening 251 in the L-shaped arm. In other words, the foot-part 257b extends from the first part 257a in a direction substantially parallel with the length extension of the center portion 256. Furthermore, a similar L-shaped arm 258 construction is formed at the second end 256b of the center portion 256 of the sound inlet structure 205. Accordingly, the first 257 and second arm 258 form an L-shaping, wherein a foot-part 257b, 258b forms a base of the L-shape, which base extends parallel with a longitudinal extension of the center portion. Furthermore, if drawing a symmetry-line along the middle of the center portion 256 it is seen that the L-shaped arms 257, 258 extending from each of the ends of the center portion are symmetrically aligned. The plane of symmetry is indicated by the dotted plane P1 in FIG. 6. The symmetry of the sound inlet structure 205 improves the sensitivity of the microphone assembly against vibrations causing a distortion in the acoustic signal if not accounted for.

The two parts 257a and 258a of the arms 257, 258 may be used to guide the sound inlet structure 205 into the inlet element 203 such that an efficient and correct mounting is achieved. In other words, an inner side 257c, 258c of the first arm 257 and second arm 258 may be arranged in a distance from each other so as to allow the PCB 204 to take up at least a part of the space formed in between the two arms. In one embodiment, the sides 257c, 258c may abut sides of the PCB to provide a guiding effect.

Furthermore, from FIG. 6 it is clearly seen that the sound channel 255 is configured in a two-step construction from the arms 257, 258. That is, a first part of the sound channel 255 extends parallel with the extension of the center portion 256 and then forms an angled extension (i.e. the inner sides of the parts 257a and 258b of the arm) to the inner sides of the center portion 256. In this way, sound is guided to the sound opening and the inner channel 159 and further into the microphone aperture 21 in the microphone housing 22 while ensuring an optimized configuration in view of vibration sensitivity of the microphone.

It should be noted, that the sound inlet structure 205 illustrated in FIGS. 5 and 6 shows an engagement between the engagement structure 252 of the sound inlet structure 205 and the inlet element 203 in accordance with the embodiment of FIGS. 1 and 2. Accordingly, it should be understood that the description of the engagement structure in view of FIGS. 1 and 2 applies for the embodiment shown in FIGS. 5 and 6, and this will therefore not be explained in further detail.

Furthermore, the embodiments shown in FIGS. 7 and 8 illustrate a construction of a microphone inlet assembly corresponding to the one described in FIGS. 5 and 6, with the main difference being that the sound inlet structure 305 comprises an engagement structure 352 which engages with the inlet element 303 on an outer surface thereof. Accordingly, features having the same construction and functionality not described in more detail and are keeping the numbering applied to FIGS. 5 and 6. The embodiment of FIGS. 7 and 8 corresponds to the engagement mechanism described in relation to FIGS. 3 and 4, and will therefore not be explained in further details.

In an embodiment, best illustrated in FIGS. 6, 8 and 12, the sound inlet structure 5, 205, 305 furthermore comprises a wax filter 7, which wax filter is arranged in connection with an opening 71 of the sound inlet structure 5, 105, 205, 305. The wax filter prevents cerumen and other particles from damaging the microphone. The wax filter may be a mesh or grid which is integrated into the sound inlet structure such that the wax filter 7 upon replacing the sound inlet structure is also exchanged. Even though, such wax filter is not illustrated in all embodiments it should be noted that the embodiments of the sound inlet structures could all be provided with or without such wax filter.

The microphone inlet assembly according to the disclosure does not only provide an efficient protection of the surface mounted microphone structure 2 but does also provide an improved sound path into the interior of the microphone structure. That is, in order to dampen unwanted sounds, such as high frequency ultrasound, which may disturb the electrical signal path from the microphone to the receiver, the sound inlet assembly 1 may in an embodiment be provided with a dampening structure.

Figure 9:
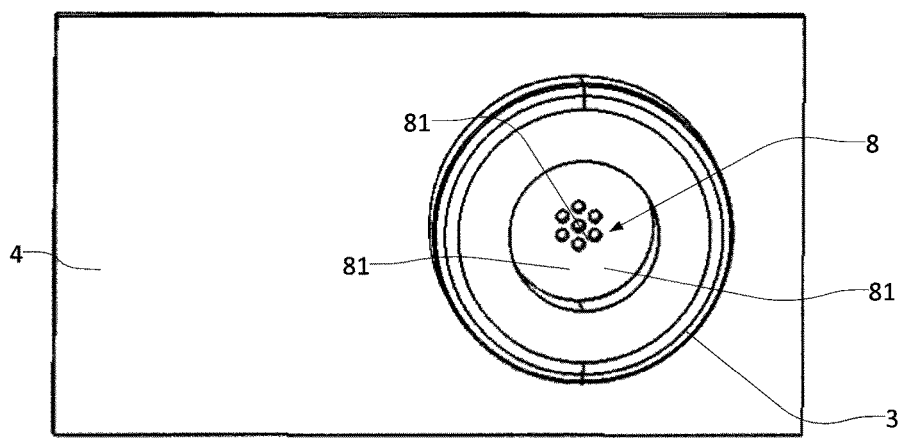
FIG. 9 illustrates details of the PCB of a part of the microphone inlet assembly according to the disclosure.
Figure 9A:
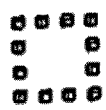
FIGS. 9A to 9E illustrate examples of opening structures provided in the PCB as a filter structure.
Figure 9B:
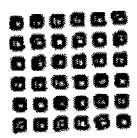
Figure 9C:
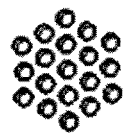
Figure 9D:
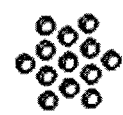
Figure 9E:
Figure 10:
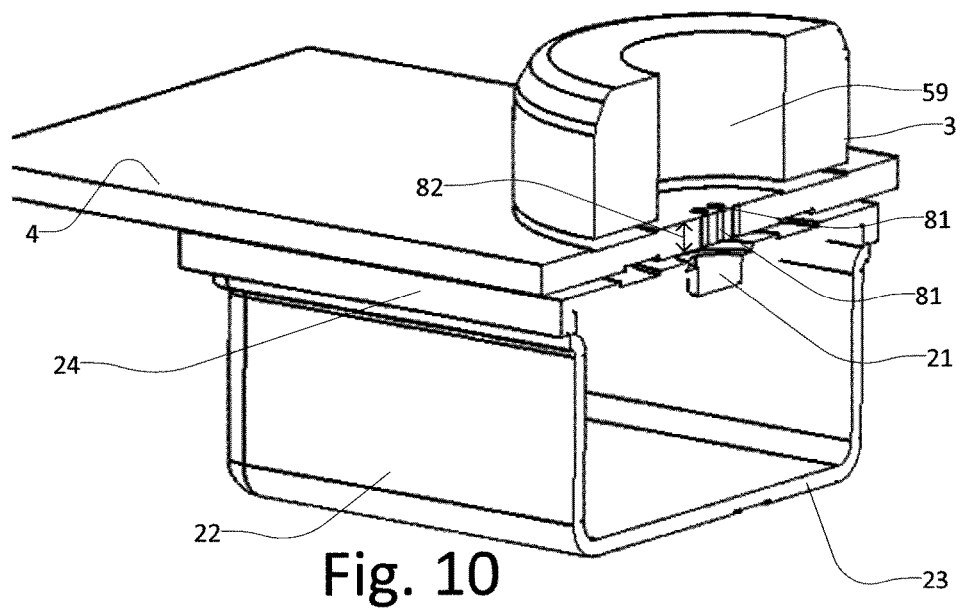
FIG. 10 illustrates a cross-sectional side view of the embodiment of FIG. 9, with a microphone soldered to the PCB.

In an embodiment best illustrated in FIG. 9, the sound inlet assembly 1 of the hearing aid is configured with a printed circuit board 4 having a filter structure 8, where the filter structure 8 is arranged between the microphone aperture 21 in the microphone housing structure 22 and the inlet element 3 (cf. FIG. 10). The filter structure 8 is configured to dampen a resonance frequency at high frequencies, such as ultrasound frequencies, which is not audible to the human ear.

In more detail, the filter structure 8 comprises one or more openings 81, which openings 81 are embedded in the printed circuit board 4, so as to be arranged between the microphone aperture 21 in the microphone housing structure 22 and the inlet element 3, as best illustrated in FIG. 10. It should be noted that within the meaning "embedded" it should be understood that the openings 81 forms part of the PCB 4, i.e. integrated into the PCB structure, so that the openings 81 substantially cover at least part of the microphone aperture 21 of the microphone structure 2.

The filter structure 8 formed as one or more holes 81 in the PCB is preferably configured to dampen a frequency response of the microphone structure in the range of 10 to 20 kHz, or preferably at least to dampen a frequency response above 20.

The dampening properties of the filter structure 8 is achieved by designing the holes 81 with specific dimensions such that sound entering the holes 81, experiences frequency dependent impedance when travelling down the holes. That is the PCB 4 has a depth 82 (illustrated by the double arrow c.f. FIG. 10), through which each of the one or more holes 81 extends. Furthermore, each hole 81 has a width defined by a point on one side of the hole 81 to an opposing point on another side of the hole 81. The amount of damping depends on the hole depth and width and on the number of holes. Sound travelling down one narrow hole (small width) meets larger impedance than sound travelling down several wider holes. Accordingly, the resonance frequency may be damped and lowered by providing sufficient sized holes and a sufficient amount of holes, which show the correct damping. That is, when choosing the hole size and depth, it has to be taken into account that a hole with a smaller cross-section extending along the length of the hole performs more damping than a hole with a larger cross-section. The combination of sufficiently designed holes thereof aids in providing the correct resonance frequency damping.

Figure 11:
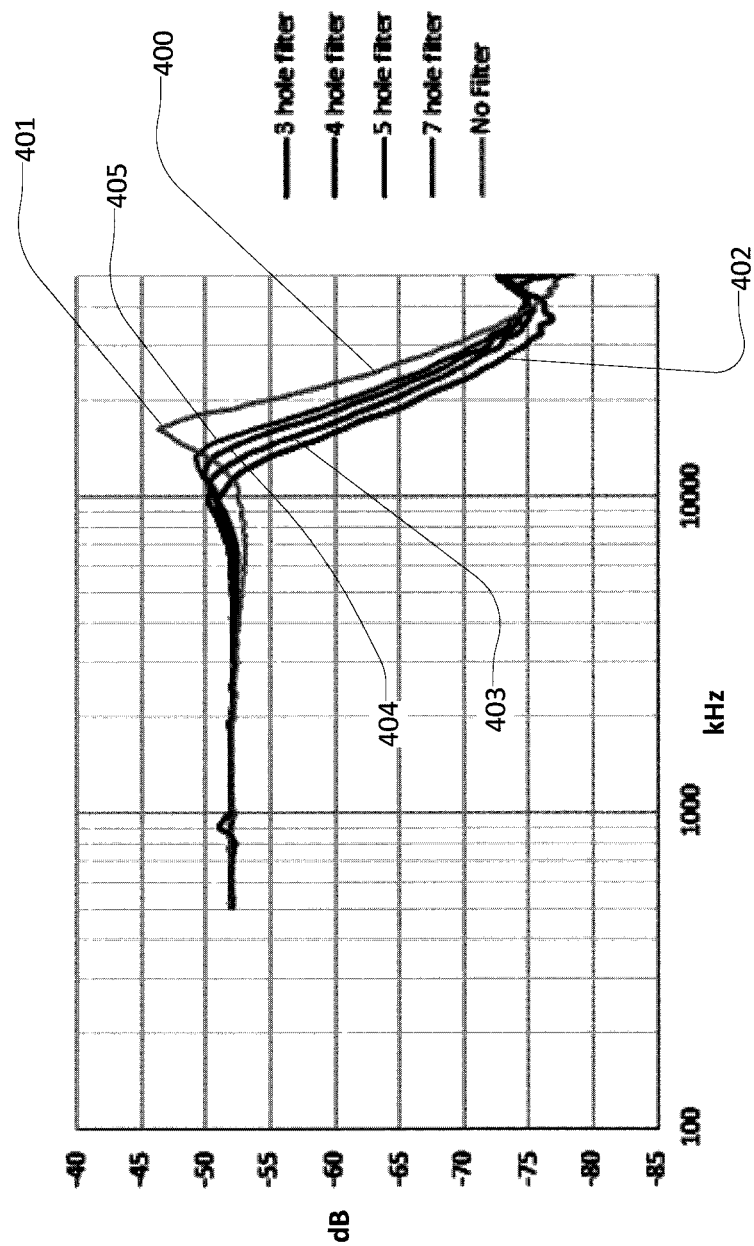
FIG. 11 illustrates the damping properties of different filter structures according to embodiments of the disclosure.

FIG. 11 shows an example of this effect. The measurements show the dampening effects on an acoustic signal in the high frequency range. The Figure illustrates the acoustic signal 400 when no filter in the PCB is applied. It is seen how the signal comprises a peak 401 around 16 kHz.

The graph shows how the application of a filter integrated in the PCB as previously described may substantially dampen the contribution from ultrasound signals above 10 kHz.

In more detail, a PCB filter having 3, 4, 5, and 7 holes, illustrated by curves 402, 403, 404 and 405 respectively, shows that fewer holes in the filter have more filtering effect and more holes have more moderate filter effect. Consequently, the design of the holes is a tool that can be used to obtain the desired dampening of high frequencies and of ultrasound.

Accordingly, in an embodiment, the number of openings formed as holes 81 in the filter structure is in the range of 3 to 7 openings, 4 to 6 or 5 openings. It should be noted that any number of holes could of course be used.

As illustrated in FIGS. 9A to 9E different patterns of holes can be used, as long as the holes are designed to provide the desired dampening.

In an embodiment according to any embodiment described herein, the microphone structure 2 is preferably a MEMS-type microphone. However, it should be noted that any other type of surface mounted microphone structure could be configured with the microphone inlet assembly as disclosed herein.

In accordance with the embodiments described herein, a method of manufacturing a hearing aid device is also disclosed. During a process of manufacturing, the method comprises the steps of:
i) providing at least one microphone structure 2 having a microphone housing structure 22 and a microphone aperture 21;
ii) providing at least one inlet element 3;
iii) providing at least one printed circuit board 4;
iv) providing at least one inlet structure 5;
v) mounting the at least one microphone housing structure 22 on a first side 42 of the printed circuit board 4;
vi) mounting the at least one inlet element 3 on a second side 43 of the printed circuit board;
vii) attaching the at least one inlet structure 5 to the at least one inlet element 3 by means of press-fitting, screwing or clicking.

Furthermore, the method may comprise the step of stamping, laser cutting, drilling or etching one-or more openings (also described as holes 81) into the printed circuit board 4 at a position so that the openings are arranged between the microphone aperture 21 in said microphone housing 22 and the inlet element 3.

Throughout the description, a microphone housing structure 22 has been described, by which wording it should be understood to mean all elements surrounding the microphone. For example, if talking about a MEMS microphone the housing structure 22 would be constructed by a cover 23 which is attached to a microphone PCB 24, as best seen in FIG. 10. Accordingly, the microphone inlet assembly having a filter structure in the PCB 4, should be understood as a construction where the filter structure PCB 4 is a different PCB 4 from the PCB 24 forming part of the microphone. In such solutions, there would therefore be two PCB-pieces soldered together, where one is provided with a filter structure 8.

It is intended that the structural features of the devices described above, either in the detailed description and/or in the claims, may be combined with steps of the method, when appropriately substituted by a corresponding process.

As used, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element but an intervening elements may also be present, unless expressly stated otherwise. Furthermore, "connected" or "coupled" as used herein may include wirelessly connected or coupled. As used herein, the term "and/or" includes any and all combinations of one or more of the associated listed items. The steps of any disclosed method is not limited to the exact order stated herein, unless expressly stated otherwise.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follow.

The invention claimed is:

1. A hearing aid device comprising:
at least one microphone structure configured for receiving an acoustic signal from an environment and to process said acoustic signal into an electrical signal;
a processing unit configured for receiving said electrical signal and modifying said signal based on a hearing loss compensation;
a receiver configured to receive said modified electrical signal and process said modified electrical signal into an acoustic signal, and further to transmit said acoustic signal to a part of the auditory system of a hearing impaired user;
wherein the microphone structure comprises:
a microphone having a microphone aperture arranged in a microphone housing structure; said hearing device further comprising a printed circuit board, wherein
an inlet element is arranged on a first side of said printed circuit board and said microphone housing structure is arranged on a second side of said printed circuit board;
said inlet element being configured to receive a sound inlet structure, said sound inlet structure being configured to provide an acoustic path from said environment to said microphone aperture that also passes through the center of said inlet element, and
the sound inlet structure is configured to be releasably attached to the inlet element.

2. Hearing device according to claim 1 wherein the sound inlet structure is configured to press-fit, snap, screw or click into engagement with said inlet element.

3. Hearing device according to claim 2, wherein said sound inlet structure comprises a first engagement structure having a first cross-section and said inlet element comprises a second engagement structure having a second cross-section, wherein said first and second engagement structures provides a sealing between said sound inlet structure and said inlet element.

4. Hearing device according to claim 2, wherein the sound inlet structure comprises a center portion having a first end and a second end, wherein a first arm extends from the first end and a second arm extends from the second end.

5. Hearing device according to claim 2, wherein the sound inlet structure furthermore comprises a wax filter, said wax filter being arranged in connection with an opening of said sound inlet structure.

6. Hearing device according to claim 1, wherein said sound inlet structure comprises a first engagement structure having a first cross-section and said inlet element comprises a second engagement structure having a second cross-section, wherein said first and second engagement structures provides a sealing between said sound inlet structure and said inlet element.

7. Hearing device according to claim 6, wherein said first cross-section is bigger than said second cross-section allowing said first engagement structure to engage an outer surface of said second engagement structure or said first cross-section is smaller than said second-cross section allowing said first engagement structure to engage an inner surface of said second engagement structure.

8. Hearing device according to claim 7, wherein the sound inlet structure comprises a center portion having a first end and a second end, wherein a first arm extends from the first end and a second arm extends from the second end.

9. Hearing device according to claim 6, wherein the sound inlet structure comprises a center portion having a first end and a second end, wherein a first arm extends from the first end and a second arm extends from the second end.

10. Hearing device according to claim 1, wherein the sound inlet structure comprises a center portion having a first end and a second end, wherein a first arm extends from the first end and a second arm extends from the second end.

11. Hearing device according to claim 10, wherein the first and second arm forms an L-shaping, wherein a base of said L-shape extends parallel with a longitudinal extension of said center portion.

12. Hearing device according to claim 1, wherein the sound inlet structure furthermore comprises a wax filter, said wax filter being arranged in connection with an opening of said sound inlet structure.

13. Hearing device according to claim 1, wherein said printed circuit board is configured with a filter structure, said filter structure being arranged between said microphone aperture in said microphone housing structure and said inlet element.

14. Hearing device according to claim 13, wherein said filter structure in said printed circuit board is configured to dampen a resonance frequency at high frequencies.

15. Hearing device according to claim 13, wherein said filter structure comprises one or more openings embedded in said printed circuit board, so as to be arranged between the microphone aperture in said microphone housing structure and said inlet element.

16. Hearing device according to claim 13, wherein said filter structure is configured to dampen a frequency response of the microphone in the range of 10 to 20 kHz and/or above 20 kHz.

17. Hearing device according to claim 13, wherein the number of openings of said filter structure is in the range of 3 to 20 openings.

18. Hearing device according to claim 1 wherein the microphone is a MEMS-type microphone or any other surface mounted microphone.

19. A method of manufacturing a hearing aid device, said method comprising the steps of
i) providing at least one microphone structure having a microphone housing structure and a microphone aperture;
ii) providing at least one inlet element;
iii) providing at least one printed circuit board;
iv) providing at least one sound inlet structure configured to be releasably attached to the inlet element;
v) mounting said at least one microphone housing structure on a first side of said printed circuitry board;
vi) mounting said at least one inlet element on a second side of said printed circuitry board;
vii) attaching said at least one sound inlet structure to said at least one inlet element by means of press-fitting, such that said at least one sound inlet structure provides an acoustic path from said environment to said microphone aperture that also passes through the center of said mounted inlet element.

20. Method according to claim 19, further comprising the step of stamping, laser cutting, drilling, or etching one or more openings into said printed circuitry board at a position so that said openings are arranged between the microphone aperture in said microphone housing and said inlet element.

* * * * *